United States Patent
Boussaha et al.

(10) Patent No.: US 11,757,168 B2
(45) Date of Patent: Sep. 12, 2023

(54) METHOD FOR MANUFACTURING A SUPERCONDUCTING LC-TYPE RESONATOR AND SUPERCONDUCTING RESONATOR THUS OBTAINED

(71) Applicants: CENTRE NATIONAL DE LA RECHERCHE SCIENTIFIQUE, Paris (FR); OBSERVATOIRE DE PARIS, Paris (FR); CY CERGY PARIS UNIVERSITÉ, Cergy (FR); SORBONNE UNIVERSITE, Paris (FR); UNIVERSITÉ DE PARIS, Paris (FR)

(72) Inventors: Faouzi Boussaha, Palaiseau (FR); Samir Beldi, Cachan (FR); Christine Chaumont, Villejuif (FR); Thibaut Vacelet, le Mesnil le Roi (FR)

(73) Assignees: CENTRE NATIONAL DE LA RECHERCHE SCIENTIFIQUE, Paris (FR); OBSERVATOIRE DE PARIS, Paris (FR); CY CERGY PARIS UNIVERSITÉ, Cergy (FR); SORBONNE UNIVERSITE, Paris (FR); UNIVERSITÉ DE PARIS, Paris (FR)

( * ) Notice: Subject to any disclaimer, the term of this patent is extended or adjusted under 35 U.S.C. 154(b) by 175 days.

(21) Appl. No.: 17/312,842

(22) PCT Filed: Dec. 4, 2019

(86) PCT No.: PCT/EP2019/083740
§ 371 (c)(1),
(2) Date: Jun. 10, 2021

(87) PCT Pub. No.: WO2020/120266
PCT Pub. Date: Jun. 18, 2020

(65) Prior Publication Data
US 2022/0037757 A1    Feb. 3, 2022

(30) Foreign Application Priority Data

Dec. 13, 2018 (FR) .................................. 1872871

(51) Int. Cl.
*H03H 7/01* (2006.01)
*H01P 7/08* (2006.01)
*H01P 11/00* (2006.01)
*H10N 69/00* (2023.01)

(52) U.S. Cl.
CPC ............ *H01P 7/082* (2013.01); *H01P 11/008* (2013.01); *H03H 7/0115* (2013.01); *H10N 69/00* (2023.02)

(58) Field of Classification Search
CPC .......... H01P 7/082; H01P 7/08; H01P 11/008; H01P 11/007; H01P 11/003; H01P 11/00;
(Continued)

(56) References Cited

U.S. PATENT DOCUMENTS

2013/0187051 A1*    7/2013    McCaughan .......... H10N 60/84
250/208.2

OTHER PUBLICATIONS

Noroozian, O., et al., "Microwave Crosstalk in Lumped Element Far-IR MKIDs," 35th International Conference on Infrared, Millimeter, and Terahertz Waves, 2010, 1 page.
(Continued)

*Primary Examiner* — Stephen E. Jones
(74) *Attorney, Agent, or Firm* — Greer, Burns & Crain, Ltd (57) ABSTRACT

A method for manufacturing a superconducting LC-type resonator of the type including at least one high-resistivity substrate on which are printed an inductive meander, a first so-called lower electrode and a second so-called upper electrode arranged opposite the first so as to form together a capacitor connected in parallel with the inductive meander, as well as inductive coupling means dedicated to the resonator, in which a sacrificial aluminium layer is deposited
(Continued)

between the first and second electrodes. Also disclosed is the superconducting LC-type resonator thus obtained and the use of such a resonator for detecting the noise of a millimetre photon.

20 Claims, 3 Drawing Sheets

(58) Field of Classification Search
CPC ...... H03H 7/01; H03H 7/0115; H03H 7/0138; H03H 7/0153; H03H 7/24; H10N 69/00
See application file for complete search history.

(56) References Cited

OTHER PUBLICATIONS

French Search Report received for Application No. 1872871, dated Oct. 31, 2019.

International Search Report and Written Opinion received for PCT/EP2019/083740, dated Jan. 24, 2020.

Cicak, K., et al., "Vacuum-Gap Capacitors for Low-Loss Superconducting Resonant Circuits," IEEE Transactions on Applied Superconductivity, vol. 19, No. 3, Jun. 2009, pp. 948-952.

Doyle, S., et al., "A review of the lumped element kinetic inductance detector," Proceedings of SPIE, San Diego, CA, vol. 7741, 2010, 11 pages.

Menz, W., et al., "Microsystem Technology," Wiley-VCH, 2001, Chapter 4.5: Physical and Chemical Coating Techniques, pp. 133-139, Chapter 4.6.1: Physical Etch Technologies, pp. 155-159, Chapter 6.2: Silicon Micromachining, pp. 225-226, and Chapter 6.3.2: Sacrificial Aluminum Micromachining, pp. 253-254.

Paul, O. et al., "Sacrificial Aluminum Etching for CMOS Microstructures," MEMS 97, Jan. 1997, pp. 523-528.

* cited by examiner

METHOD FOR MANUFACTURING A SUPERCONDUCTING LC-TYPE RESONATOR AND SUPERCONDUCTING RESONATOR THUS OBTAINED

BACKGROUND

The subject of the present invention is a method for manufacturing a superconducting LC-type resonator and also the superconducting resonator thus obtained in order to function as, among other things, an electromagnetic wave detector.

Thanks to their unrivalled performance, particularly in terms of sensitivity, which can be close to the quantum limit given by the photon noise, superconducting LC-type resonators seem to perform well in detecting the primordial light emitted at the beginning of the expansion of the universe, probing the interstellar medium, which is the site of star formation, or also studying the physicochemical processes of planetary atmospheres, including that of the Earth.

Turning now to millimetre photons, i.e. having energies of the order of millielectronvolts, superconducting materials having an excitation energy of the same order of magnitude, when the latter are used as microwave kinetic inductance detectors (MKIDs), become particularly suitable for the detection of millimetre photons.

MKIDs are currently being used for example in the NIKA project originating from a collaboration between the Institut Néel and IRAM Grenoble to probe the interstellar medium in the millimetre range.

These MKIDs are constituted by an inductive meander which acts as an absorber of the electromagnetic radiation, in parallel with an interdigitated capacitor.

It is therefore necessary to use an inductor of the inductive meander type in order for these resonators to be detectors as well.

Thus, the resonators described in the article referenced as IEEE TRANSACTIONS ON APPLIED SUPERCONDUCTIVITY, 16 Jun. 2009, pages 948-952, XP011262430, DOI: 10.1109/TASC.2009.2019665, written by KATARINA CICAK ET AL. and entitled "Vacuum-Gap Capacitors for Low-Loss Superconducting Resonant Circuits", cannot be used as detector when the inductor is not an inductive meander. In addition, the electrodes are made of aluminium, and therefore susceptible to oxidation, which generates noise.

By "inductive meander" is therefore meant any inductor taking the form of a wire or strip uncoiled in a winding manner.

The thus-obtained LC circuit is coupled to a planar read line through which it is excited by the application of a microwave signal. The line also serves to measure the frequency and the phase of the resonance.

The article PROCEEDINGS OF SPIE, vol. 7741, from 16 Jul. 2010, referenced as XP055635532, DOI: 10.1117/12.857341, written by SIMON DOYLE ET AL. and entitled "A review of the lumped element kinetic inductance detector", describes such an MKID equipped with a planar (2D and not 3D) interdigitated capacitor.

The operating principle of an MKID is as follows. When a photon is absorbed by a thin superconducting layer of the inductive part, its energy breaks the Cooper pairs and modifies the surface inductance of the thin layer, as a result bringing about the modification of the natural frequency as well as the phase of the LC circuit.

However, there is an intrinsic noise which has been identified in devices with superconducting resonators, but the mechanism of which is still not fully understood: it is the noise of the systems on two levels (or TLS noise, for Two-Level System noise) primarily generated at the level of the capacitive part at the interface between the superconducting material of the resonator and the, generally amorphous, dielectric.

Even at a very low temperature, this noise brings about disturbances in the resonator in the form of a noise with a component that is inversely proportional to the frequency. In the knowledge that MKIDs are produced using superconducting films deposited on a silicon substrate, the TLS noise is currently the major obstacle to achieving sensitivities close to the quantum limit given by the photon noise.

To get away from this noise as much as possible, research teams are attempting to develop resonators with capacitors using non-amorphous dielectrics such as monocrystalline silicon. However, it is difficult to implement MKIDs with such a dielectric and, for all that, a substantial performance gain is not guaranteed.

In order to effectively reduce the TLS noise, in the knowledge that it is predominant in the capacitive part, the invention proposes manufacturing superconducting LC-type resonators having a capacitor without dielectric, and the parallel electrodes of which are separated by vacuum.

The empty space between the two electrodes must be small enough, typically a few hundreds, or even a few tens, of nanometres, to maintain a resonant frequency low enough, typically a few GHz, to be easily measured with reading electronics that are low cost and simple to implement.

SUMMARY

To this end, the invention proposes a method for manufacturing a superconducting LC-type resonator of the type comprising at least one high-resistivity substrate on which the following are printed: an inductive meander, a first electrode known as lower and a second electrode known as upper arranged opposite the first so as to form together a capacitor connected in parallel with the inductive meander, as well as inductive coupling means dedicated to said resonator, in which at least the following steps are carried out in succession:

- a step E0 of providing the high-resistivity substrate,
- a step E1 of simultaneously printing the inductive meander and the lower electrode,
- a step E2 of printing the coupling means,
- a step E3 of printing an aluminium layer completely covering the lower electrode,
- a step E4 of printing the upper electrode on the aluminium layer,
- a step E5 of dissolving the aluminium layer.

Optional, additional or substitute features of the invention are set out hereinafter.

According to some features, the printing step E3 can result in an aluminium layer with a thickness that varies from a few tens to a few hundreds of nanometres.

According to some features, the printing step E3 can result in an aluminium layer with a thickness smaller than 400 nm, preferably smaller than 150 nm, still more preferably comprised between 40 and 70 nm.

According to other features, the step E1 of simultaneously printing the inductive meander and the lower electrode can be performed using lithography techniques, preferably optical lithography, followed by reactive-ion etching, starting from a layer of titanium nitride (TiN) with a thickness of the order of 60 nm deposited beforehand using PVD techniques, preferably cathode sputtering techniques.

According to still other features, the printing step E2 can consist of producing a coplanar read line of the order of 50 Ohms made of niobium and with a thickness of the order of 100 nm, using lithography techniques, preferably optical lithography, followed by PVD depositions, preferably cathode sputtering depositions, then definition using lift-off techniques.

According to still other features, the step E3 of printing the aluminium layer can be performed using lithography techniques, preferably optical lithography, followed by PVD depositions, preferably cathode sputtering depositions, then definition using lift-off techniques.

According to still other features, the printing step E4 can result in the production of the upper electrode from a material chosen from the list defined by (TiN, TaN, NbN) using lithography techniques, preferably optical lithography, followed by PVD depositions, preferably cathode sputtering depositions, then definition using lift-off techniques.

Unlike the aluminium used in the article referenced as IEEE TRANSACTIONS ON APPLIED SUPERCONDUCTIVITY, 16 Jun. 2009, pages 948-952, XP011262430, DOI: 10.1109/TASC.2009.2019665, written by KATARINA CICAK ET AL. and entitled "Vacuum-Gap Capacitors for Low-Loss Superconducting Resonant Circuits", or niobium, the materials TiN, TaN and NbN, which are obtained by the process of nitriding Ti, Ta and Nb respectively, are more stable and do not easily oxidize.

According to still other features, the printing step E4 can result in the production of the upper electrode from TiN using lithography techniques, preferably optical lithography, followed by PVD depositions, preferably cathode sputtering depositions, then definition using lift-off techniques.

According to still other features, the dissolving step E5 can be carried out by immersing the resonator in a developer consisting of a basic solution with a PH greater than 10.5 containing, preferably, ammonia or else tetramethylammonium hydroxide, for a duration comprised between 20 and 60 minutes.

According to still other features, the step E4 of printing the upper electrode can lead to the formation of an upper electrode constituted by N microbridges in parallel and connected at their respective ends by two strips.

According to still other features, during steps E1, E3, E4, a plurality of lower electrodes and upper electrodes, arranged to form a plurality of capacitors in parallel, can be printed.

Another subject of the invention is a superconducting LC-type resonator of the type comprising at least one high-resistivity substrate on which the following are printed: an inductive meander, a first electrode known as lower and a second electrode known as upper arranged opposite the first so as to form together a capacitor connected in parallel with the inductive meander, as well as RF coupling means dedicated to said resonator, in which the first electrode known as lower and the second electrode known as upper are substantially parallel and separated by an empty space with a distance that varies from a few tens to a few hundreds of nanometres.

Optional, additional or substitute features of the invention are set out hereinafter.

According to some features, the first electrode known as lower and the second electrode known as upper can be substantially parallel and separated by an empty space with a distance shorter than 400 nm, preferably shorter than 150 nm, still more preferably comprised between 40 and 70 nm.

According to some features, the substrate can be chosen from the list defined by high-resistivity silicon substrates and sapphires with a diameter of 2 inches and a thickness of 330 µm, quartz, silicon dioxide, silicon carbide.

According to other features, the inductive meander and the lower electrode can be etchings of titanium nitrides (TiN) with a thickness comprised between 40 and 80 nm, preferably of the order of 60 nm.

According to still other features, the coupling means can constitute a coplanar read line etched on the substrate, of 50 Ohms and made of niobium (Nb), with a thickness comprised between 80 and 150 nm, preferably of the order of 100 nm.

According to still other features, the upper electrode can be constituted primarily by a material chosen from the list defined by (TiN, TaN, NbN) using lithography techniques, preferably optical lithography, followed by PVD depositions, preferably cathode sputtering depositions, then definition using lift-off techniques with a thickness comprised between 350 and 550 nm.

According to still other features, the upper electrode can be constituted by N microbridges in parallel and connected at their respective ends by two strips.

According to still other features, the resonator can comprise a plurality of lower electrodes and upper electrodes, arranged to form a plurality of capacitors in parallel, so that said resonator demonstrates a resonance comprised between 0.1 and 8 GHz as well as an intrinsic quality factor Qi greater than 700,000.

Another subject of the invention is the use of a superconducting LC-type resonator according to the invention for detecting electromagnetic radiation in the millimetre/submillimetre to X-ray range.

BRIEF DESCRIPTION OF THE DRAWINGS

Other advantages and particular features of the invention will become apparent on reading the detailed description of entirely non-limitative implementations and embodiments, and the following attached drawings.

DETAILED DESCRIPTION

For the sake of clarity and conciseness, the references in the figures correspond to the same elements.

As the embodiments described hereinafter are in no way limitative, variants of the invention can in particular be considered comprising only a selection of features described, in isolation from the other features described (even if this selection is isolated within a sentence comprising these other features), if this selection of features is sufficient to confer a technical advantage or to differentiate the invention with respect to the state of the prior art.

This selection comprises at least one, preferably functional, feature without structural details, or with only a part of the structural details if this part alone is sufficient to confer a technical advantage or to differentiate the invention with respect to the state of the prior art.

Figure 2:
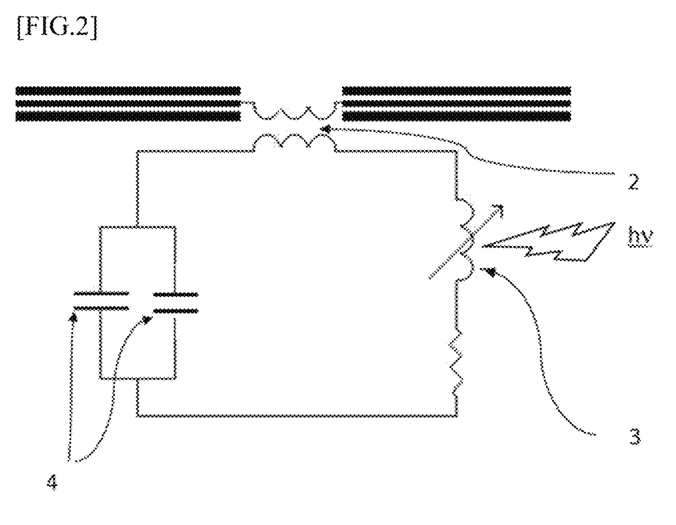
FIG. 2 is a schematic diagram of a superconducting LC-type resonator.

FIG. 2 serves as a reminder of the operating principle of an MKID constituted by an inductive meander 3 with an inductance L which acts as an absorber of electromagnetic radiation, in parallel with an interdigitated capacitor 4.

The thus-obtained LC circuit is coupled to a planar read line, which serves as coupling means 2, and through which it is excited by the application of a microwave signal. The line also serves to measure the frequency and the phase of the resonance.

As a reminder, kinetic inductance detectors (MKIDs), also called microwave kinetic inductance detectors, are superconducting LC-type photon detectors developed for the first time by scientists from the California Institute of Technology and from the Jet Propulsion Laboratory in 3.

They operate at cryogenic temperatures, generally lower than 1 kelvin (for example −0.1 K) and are used for high astronomical sensitivity of detection for frequencies ranging from the far infrared to X-rays.

The operating principle is as follows. Photons incident on a band of superconducting material break the Cooper pairs and create an excess of quasi particles.

In condensed matter physics, a Cooper pair or a BCS pair is a pair of electrons (or other fermions) bound together at low temperature. The state of the Cooper pair is responsible for the superconductivity.

Also as a reminder, superconductivity is a phenomenon where electrical resistance is absolutely zero and magnetic flux fields are expelled, which occurs in certain materials, called superconductors, when they are cooled below a characteristic critical temperature.

Still as a reminder, a resonator is a device which has a resonance or a resonance behaviour, oscillating at some frequencies, called its resonant frequencies, with a larger amplitude than at others. The oscillations in a resonator can be either electromagnetic or mechanical (including acoustic).

Resonators are used to generate waves with specific frequencies or to select specific frequencies starting from a signal.

The kinetic inductance of the superconducting strip is inversely proportional to the density of the Cooper pairs, so that the kinetic inductance increases during the absorption of photons.

This inductance is combined with a capacitor to form a hyperfrequency resonator the resonant frequency of which varies with the absorption of the photons.

This reading based on the resonator is useful for developing large-format detector arrays because each MKID can be addressed by a single hyperfrequency tonality and numerous detectors can be measured with the aid of a single broadband hyperfrequency channel, a technique known as frequency-division "multiplexing".

The phenomenon of electrical resonance occurs in an electrical circuit at a given resonant frequency where the imaginary portions of the impedances and admittance of the circuit elements cancel each other out.

In certain circuits, the electrical resonance takes place when the impedance between the input and the output of the circuit is close to zero and the transfer function is close to one.

The resonant circuits have reverberations and can generate higher voltages and currents than those that they receive, which makes them useful for wireless transmission.

Figure 1:
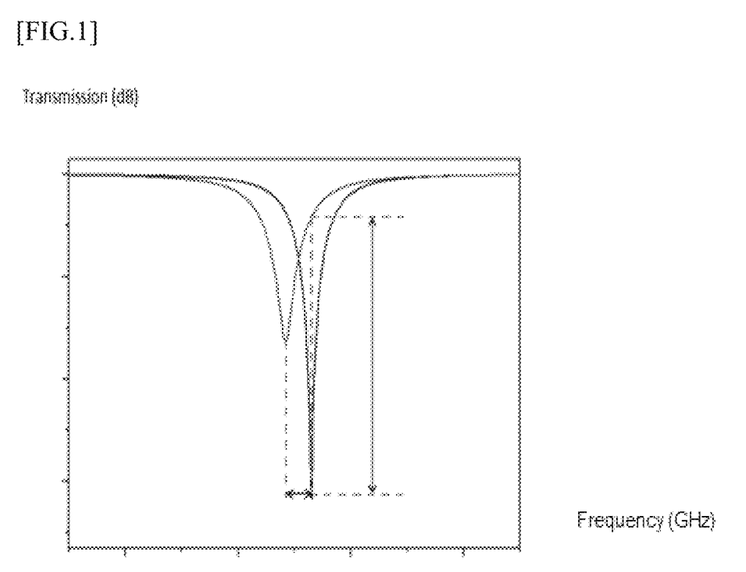
FIG. 1 is a graph illustrating the modification of the properties of a superconducting substrate after absorption of a photon.

FIG. 1 also serves as a reminder that, when a photon is absorbed by the thin superconducting layer of the inductive part 3, its energy breaks the Cooper pairs and modifies the surface inductance of the thin layer, as a result bringing about the modification of the natural frequency as well as the phase of the LC circuit.

The present invention therefore relates to the production of a capacitor 4 without dielectric, the upper electrode of which is suspended at a few hundreds of nanometres from the lower electrode thanks to the use of an aluminium layer.

The latter acts as a sacrificial layer and replaces the photosensitive resins.

Its thickness precisely determines the gap between the two electrodes and as a result the value of the capacitance.

More precisely, electrodes separated by an empty space with a distance that varies from a few tens to a few hundreds of nanometres are produced in this way.

Advantageously, electrodes separated by an empty space with a distance shorter than 400 nm, preferably shorter than 150 nm, still more preferably comprised between 40 and 70 nm, are produced in this way.

The method for manufacturing a superconducting LC-type resonator according to the invention comprises an initial step E0 which consists of providing a high-resistivity substrate.

The substrate must be a high-resistivity substrate which can be chosen from high-resistivity silicon substrates, sapphires with a diameter of two inches and a thickness of 330 μm, quartz, silicon dioxide, silicon carbide.

Followed by:
a step E1 of simultaneously printing the inductive meander 3 and the lower electrode 41,
a step E2 of printing the coupling means 2,
a step E3 of printing an aluminium layer completely covering the lower electrode 41,
a step E4 of printing the upper electrode 40 on the aluminium layer, and finally
a step E5 of dissolving the aluminium layer.

The invention therefore makes it possible to obtain a superconducting LC-type resonator the capacitor 4 of which is free of dielectric.

According to the invention, the electrodes are separated by an empty space with a distance that varies from a few tens to a few hundreds of nanometres.

Preferably, the printing step E3 results in an aluminium layer with a thickness smaller than 400 nm, preferably smaller than 150 nm, still more preferably comprised between 40 and 70 nm.

The empty space between the two electrodes must in fact be small enough to maintain a resonant frequency low enough, typically of the order of a few GHz, that it can be easily measured with reading electronics that are low cost and simple to implement.

Preferably, the step E1 of simultaneously printing the inductive meander 3 and the lower electrode 41 is performed using the optical lithography technique followed by reactive-ion etching, starting from a layer of titanium nitride (TiN) with a thickness of the order of 60 nm deposited beforehand using cathode sputtering.

Also preferably, the printing step E2 consists of producing a coplanar read line of the order of 50 Ohms made of niobium and with a thickness of the order of 100 nm, using the techniques of optical lithography, cathode sputtering deposition and lift-off.

Also preferably, the step E3 of printing the aluminium layer is performed using the techniques of optical lithography, cathode sputtering deposition and lift-off.

Unlike with photosensitive resins, aluminium layers with very small thicknesses, up to 10 nm, can thus be deposited with very high precision (±1 nm) over a large surface area.

Also preferably, the printing step E4 results in the production of the upper electrode 40 primarily constituted by a material chosen from the list defined by (TiN, TaN, NbN) with a band gap greater than or equal to 2 electronvolts, using the techniques of optical lithography, and cathode sputtering deposition, and lift-off. Titanium nitride can be favoured.

The main items of equipment used are a mask aligner having a 365-nm UV lamp and a cathode sputtering bench equipped with Nb, Al and Ti targets.

Thus, the preferred embodiments of these manufacturing steps are therefore essentially based on the use of techniques which are perfectly understood at this time, namely the techniques of photolithography and deposition of thin layers by cathode sputtering.

Other lithography techniques could be used instead of optical lithography.

Other PVD techniques could also be used instead of cathode sputtering.

Also preferably, the dissolving step E5 is carried out by immersing the resonator in a developer containing tetramethylammonium hydroxide, for a duration comprised between 20 and 60 minutes.

The aluminium layer is thus slowly dissolved (25 to 30 min for a thickness of 150 nm) thanks to the interaction with the tetramethylammonium hydroxide contained in the developer, which makes it possible to delicately release the upper electrode.

By way of example, photosensitive resin developers commonly used in the field of nanotechnology and microtechnology can be used, such as MF319 or MF26 sold by the company SHIPLEY.

Other basic solutions with a PH higher than 10.5, such as ammonia, can also be used.

Also preferably, the step E4 of printing the upper electrode 40 leads to the formation of an upper electrode constituted by N microbridges 4010 connected in parallel at their respective ends by two strips 4011.

The comb shape of the upper electrode 40 makes it possible, on the one hand, for the developer to penetrate and diffuse better between the electrodes and, on the other hand, to reduce the risks of the upper electrode collapsing or breaking if it was larger and full.

The upper electrode 40 obtained in this way with TiN represents a three-dimensional, and not planar, structure.

This structure, which does not require supporting pillars, has suitable stress concentrations, which mean that it does not collapse.

Furthermore, in order to advantageously increase the value of the total capacitance of the superconducting resonator, it is recommended to print a plurality of lower electrodes and upper electrodes, arranged to form a plurality of capacitors in parallel (cf. FIG. 2 with two capacitors C and C' in parallel).

The results for such a resonator are discussed in the following pages.

Figure 3:
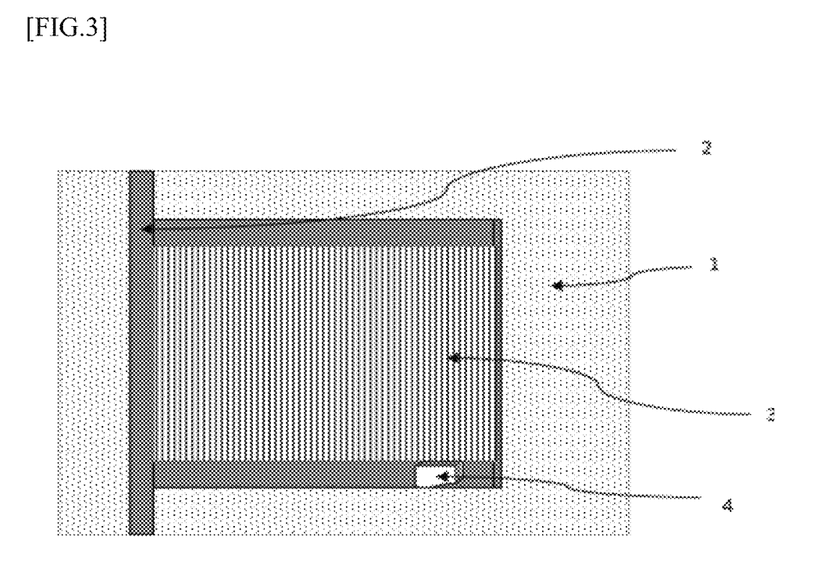
FIG. 3 is a schematic diagram of a superconducting LC-type resonator according to the invention.

As illustrated in FIG. 3, the superconducting resonator according to the invention comprises at least one high-resistivity substrate 1 on which the following are printed: an inductive meander 3, a first electrode 41 known as lower and a second electrode 40 known as upper arranged opposite the first so as to form together a capacitor 4 connected in parallel with the inductive meander 3.

According to the invention, the first electrode 41 known as lower and the second electrode 40 known as upper are substantially parallel and separated by an empty space with a distance that varies from a few tens to a few hundreds of nanometres.

Advantageously, the first electrode 41 known as lower and the second electrode 40 known as upper are substantially parallel and separated by an empty space with a distance shorter than 400 nm, preferably shorter than 150 nm.

It is even possible to obtain a distance comprised between 40 and 70 nm.

The substrate can be a high-resistivity silicon substrate, or else chosen from sapphires with a diameter of 2 inches and a thickness of 330 μm, quartz, silicon dioxide, silicon carbide.

The inductive meander 3 and the lower electrode 41 are preferably etchings of titanium nitrides TiN with a thickness comprised between 40 and 80 nm, preferably of the order of 60 nm.

The coupling means 2 constitute a coplanar read line etched on the substrate, of the order of 50 Ohms. They are preferably made of niobium with a thickness comprised between 80 and 150 nm, preferably of the order of 100 nm. The coplanar read line ensures an optimum RF coupling with the LC resonator.

The upper electrode 40 can be an etching in a material chosen from the list defined by (TiN, TaN, NbN) with a band gap greater than or equal to 2 electronvolts with a thickness comprised between 350 and 550 nm.

The upper electrode 40 preferably obtained with TiN makes it possible to obtain a three-dimensional, and not planar, structure.

This structure, which does not require supporting pillars, has particularly suitable stress concentrations, which mean that it does not collapse.

Figure 4:
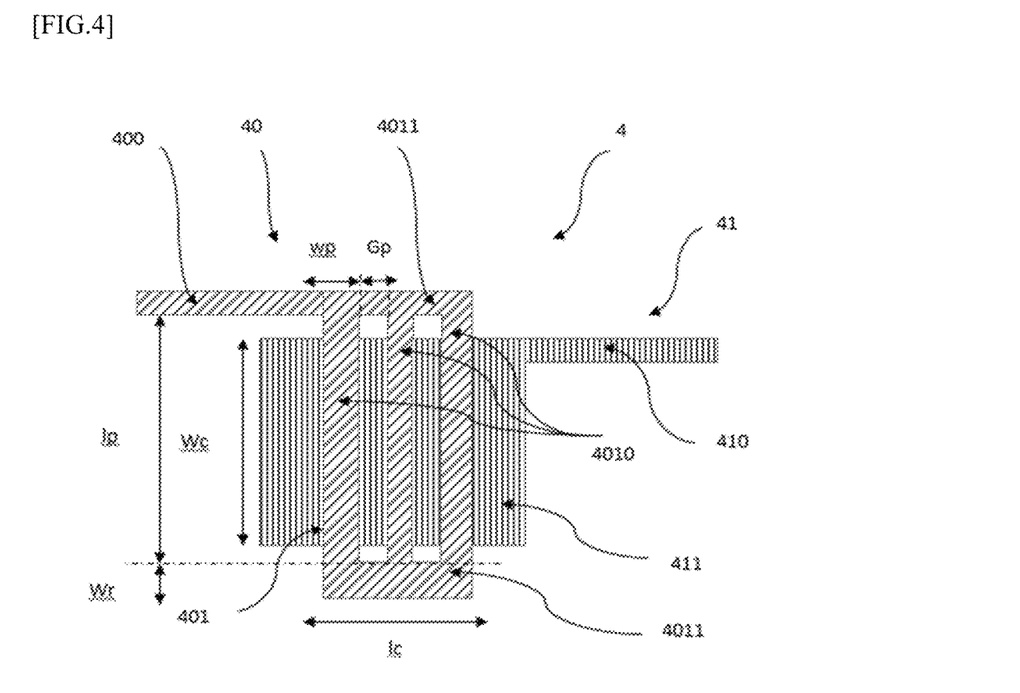
FIG. 4 is a detail from the schematic diagram of a superconducting LC-type resonator according to the invention.

As represented in FIG. 4, the upper electrode 40 is composed of a plate 401 and a connection 400 to the LC circuit.

Similarly, the lower electrode 41 is composed of a plate 411 and a connection 410 to the LC circuit.

Preferably, the plate 401 of the upper electrode 40 is constituted by N microbridges 4010 connected in parallel at their respective ends by two perpendicular strips 4011 resting directly on the substrate. These strips also act as bearing points of the microbridges on the substrate.

The typical dimensions of the capacitors produced are indicated in Table 1. By way of example, nanobridges that vary between 32 and 35 μm in length Ip and between 9 and 18 μm in width Wp were defined.

In order to vary the value of the capacitance, it is sufficient to vary the number of microbridges N. It can be calculated by:

$$C = \varepsilon_r \times S_{eff}/d = \varepsilon_r \times (NW_p - (N-1)Gp)Wc/d$$

where:
C: capacitance
$\varepsilon_r$: permittivity of the vacuum
$S_{eff}$: effective surface area of the capacitor
d: distance between the electrodes
$W_c$: width of the lower electrode $W_p$: width of a nanobridge $G_p$: distance between two bridges.

Thus, as a function of the number of microbridges, the value of the capacitance can vary from a few hundreds of fF to several tens of pF for a space between the electrodes of the order of 150 nm.

According to an advantageous embodiment represented in FIG. 2, two capacitors 4 in parallel with a respective value C and C' are shown.

According to this principle, the resonator comprises a plurality of lower electrodes and upper electrodes, arranged to form a plurality of capacitors in parallel, so that said resonator demonstrates a resonant frequency comprised between 0.1 and 8 GHz as well as an intrinsic quality factor Qi greater than 700,000.

Figure 5:
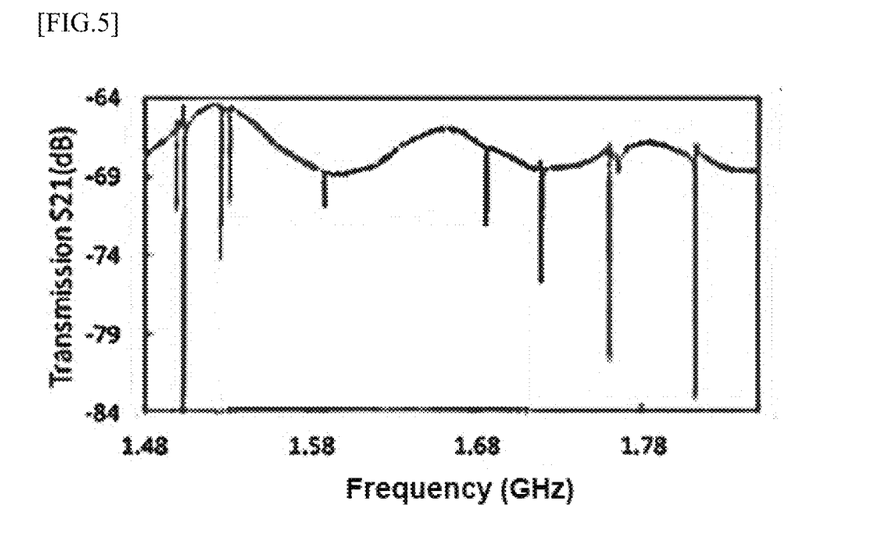
FIG. 5 is a graph illustrating the resonances obtained with MKIDs based on capacitors with suspended upper electrodes without dielectric according to the invention.

According to a particular application, the results of which are illustrated in FIG. 5, it is beneficial to print several LC resonators on one and the same substrate 1, so as to obtain a system having several resonant frequencies.

These systems can for example participate in the composition of cameras for detecting several distinct compounds in the millimetre and submillimetre range.

In summary, the method according to the invention thus makes it possible to dispense with dielectrics, which are sources of intrinsic noise in several superconducting components such as low-noise detectors and amplifiers.

The method according to the invention is in particular dedicated to the manufacture of superconducting LC-type resonators dedicated to the detection of electromagnetic radiation in the millimetre/submillimetre to X-ray range.

Figure 6:
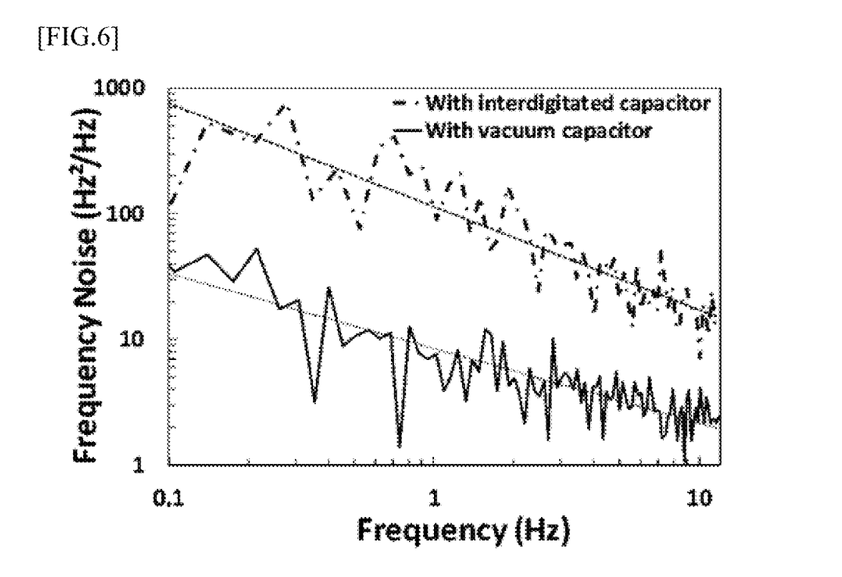
FIG. 6 is a comparison graph illustrating the fluctuations in the dielectric constant observed in the case of MKIDs according to the invention and in the case of MKIDs with interdigitated capacitors.

As represented in FIG. 6, the capacitor implemented in the invention makes it possible to reduce the intrinsic noise by up to five times, compared with the interdigitated capacitors known from the state of the art.

It is in fact accepted that the TLS noise causes fluctuations in the dielectric constant and, as a result, in the value of the capacitance. This variation in the capacitance in turn brings about random variations in the resonant frequency ($f_{res}=\frac{1}{2\pi}(LC)^{1/2}$).

One of the experimental methods for quantifying this noise consists of measuring the fluctuations in the resonant frequency when an RF signal with a frequency fsig excites the resonator.

The preliminary results in FIG. 6 show that a resonator with a vacuum capacitor produced with the method according to the invention has made it possible to reduce the frequency noise by a factor of 5 compared with a resonator using a conventional interdigitated capacitor (2.8 Hz²/Hz instead of 14 Hz²/Hz measured at $f_{sig}$=10 Hz).

It should be noted that the different features, forms, variants and embodiments of the invention can be combined with each other, in various combinations, unless they are incompatible or mutually exclusive.

The invention claimed is:

1. A superconducting LC-type resonator of the type comprising: at least one high-resistivity substrate on which the following are printed: an inductive meander; a first electrode known as lower; and a second electrode known as upper arranged opposite the first so as to form together a capacitor connected in parallel with the inductive meander; as well as RF coupling means dedicated to said resonator, the first electrode known as lower and the second electrode known as upper are substantially parallel and separated by an empty space with a distance that varies from a few tens to a few hundreds of nanometres.

2. The superconducting LC-type resonator according to claim 1, characterized in that the first electrode known as lower and the second electrode known as upper are substantially parallel and separated by an empty space with a distance shorter than 400 nm.

3. The superconducting LC-type resonator according to claim 1, characterized in that the substrate is chosen from the list defined by high-resistivity silicon substrates, sapphires with a diameter of 2 inches and a thickness of 330 μm, quartz, silicon dioxide, silicon carbide.

4. The superconducting LC-type resonator according to claim 1, characterized in that the inductive meander and the lower electrode are etchings of titanium nitrides (TiN) with a thickness comprised between 40 and 80 nm.

5. The superconducting LC-type resonator according to claim 1, characterized in that the coupling means constitute a coplanar read line etched on the substrate, of 50 Ohms and made of niobium (Nb), with a thickness comprised between 80 and 150 nm.

6. The superconducting LC-type resonator according to claim 1, characterized in that the upper electrode is an electrode with a thickness comprised between 350 and 550 nm constituted primarily by a material chosen from the list defined by (TiN, TaN, NbN) using lithography techniques, preferably optical lithography, followed by PVD depositions, preferably cathode sputtering depositions, then definition using lift-off techniques.

7. The superconducting LC-type resonator according to claim 1, characterized in that the upper electrode is constituted by N microbridges in parallel and connected at their respective ends by two strips.

8. The superconducting LC-type resonator according to claim 1, characterized in that it comprises a plurality of lower electrodes and upper electrodes, arranged to form a plurality of capacitors in parallel, so that said resonator demonstrates a resonance comprised between 0.1 and 8 GHz as well as an intrinsic quality factor Qi greater than 700,000.

9. A use of a superconducting LC-type resonator according to claim 1 for detecting electromagnetic radiation in the millimetre/submillimetre to X-ray range.

10. A method for manufacturing a superconducting LC-type resonator of the type comprising: at least one high-resistivity substrate on which the following are printed: an inductive meander; a first electrode known as lower and a second electrode known as upper arranged opposite the first so as to form together a capacitor connected in parallel with the inductive meander; as well as inductive coupling means dedicated to said resonator; including at least the following steps carried out in succession:
   a step E0 of providing the high-resistivity substrate;
   a step E1 of simultaneously printing the inductive meander and the lower electrode;
   a step E2 of printing the coupling means;
   a step E3 of printing an aluminium layer completely covering the lower electrode;
   a step E4 of printing the upper electrode on the aluminium layer; and
   a step E5 of dissolving the aluminium layer.

11. The method for manufacturing a superconducting LC-type resonator according to claim 10, characterized in that the printing step E3 results in an aluminium layer with a thickness that varies from a few tens to a few hundreds of nanometres.

12. The method for manufacturing a superconducting LC-type resonator according to claim 10, characterized in that the printing step E3 results in an aluminium layer with a thickness smaller than 400 nm.

13. The method for manufacturing a superconducting LC-type resonator according to claim 10, characterized in that the step E1 of simultaneously printing the inductive meander and the lower electrode is performed using lithography techniques, preferably optical lithography, followed by reactive-ion etching, starting from a layer of titanium nitride (TiN) with a thickness of the order of 60 nm deposited beforehand using PVD techniques, preferably cathode sputtering techniques.

14. The method for manufacturing a superconducting LC-type resonator according to claim 10, characterized in that the printing step E2 includes producing a coplanar read line of the order of 50 Ohms made of niobium and with a thickness of the order of 100 nm, using lithography techniques, preferably optical lithography, followed by PVD depositions, preferably cathode sputtering depositions, then definition using lift-off techniques.

15. The method for manufacturing a superconducting LC-type resonator according to claim 10, characterized in that the step E3 of printing the aluminium layer is performed using lithography techniques, preferably optical lithography, followed by PVD depositions, preferably cathode sputtering depositions, then definition using lift-off techniques.

16. The method for manufacturing a superconducting LC-type resonator according to claim 10, characterized in that the printing step E4 can result in the production of the upper electrode primarily constituted by a material chosen from the list defined by (TiN, TaN, NbN) using lithography techniques, preferably optical lithography, followed by PVD depositions, preferably cathode sputtering depositions, then definition using lift-off techniques.

17. The method for manufacturing a superconducting LC-type resonator according to claim 10, characterized in that the printing step E4 results in the production of the upper electrode from TiN using lithography techniques, preferably optical lithography, followed by PVD depositions, preferably cathode sputtering depositions, then definition using lift-off techniques.

18. The method for manufacturing a superconducting LC-type resonator according to claim 10, characterized in that the dissolving step E5 is carried out by immersing the resonator in a developer, including a basic solution with a PH greater than 10.5 containing, preferably, ammonia or else tetramethylammonium hydroxide, for a duration comprised between 20 and 60 minutes.

19. The method for manufacturing a superconducting LC-type resonator according to claim 10, characterized in that the step E4 of printing the upper electrode leads to the formation of an upper electrode constituted by N microbridges connected in parallel at their respective ends by two strips.

20. The method for manufacturing a superconducting LC-type resonator according to claim 10, characterized in that, during steps E1, E3, E4, a plurality of lower electrodes and upper electrodes, arranged to form a plurality of capacitors in parallel, are printed.

* * * * *